United States Patent
Fein et al.

(10) Patent No.: US 9,049,093 B2
(45) Date of Patent: Jun. 2, 2015

(54) CODED PULSE DATA TRANSMISSION USING A LOOK-UP TABLE

(75) Inventors: Gene Fein, Malibu, CA (US); Edward Merritt, Lenox, MA (US)

(73) Assignee: Seagate Technology LLC, Cupertino, CA (US)

( * ) Notice: Subject to any disclaimer, the term of this patent is extended or adjusted under 35 U.S.C. 154(b) by 1205 days.

(21) Appl. No.: 12/955,410

(22) Filed: Nov. 29, 2010

(65) Prior Publication Data

US 2011/0069970 A1 Mar. 24, 2011

Related U.S. Application Data

(63) Continuation of application No. 12/273,933, filed on Nov. 19, 2008, now abandoned.

(51) Int. Cl.
*H04N 7/12* (2006.01)
*H04L 25/49* (2006.01)
*H03M 7/40* (2006.01)

(52) U.S. Cl.
CPC ............. *H04L 25/4902* (2013.01); *H03M 7/40* (2013.01)

(58) Field of Classification Search
CPC .......................... H04L 25/4902; H03M 7/40
USPC ........ 375/240, 240.01, 240.23; 398/135, 189; 382/246; 710/52; 348/333.03, 405.1; 455/456.1
See application file for complete search history.

(56) References Cited

U.S. PATENT DOCUMENTS

| | | | |
|---|---|---|---|
| 5,557,540 A | 9/1996 | Miyashita | |
| 5,664,226 A * | 9/1997 | Czako et al. | 710/52 |
| 6,188,494 B1 * | 2/2001 | Minteer | 398/135 |
| 6,498,866 B2 | 12/2002 | Charrier et al. | |
| 6,509,929 B1 * | 1/2003 | Ishikawa | 348/405.1 |
| 6,889,051 B2 * | 5/2005 | Ogino et al. | 455/456.1 |
| 6,909,811 B1 * | 6/2005 | Kajiwara et al. | 382/246 |
| 6,917,384 B1 * | 7/2005 | Fukushima | 348/333.03 |
| 6,941,037 B2 | 9/2005 | Georges | |
| 6,967,945 B2 | 11/2005 | Hethuin | |
| 7,376,357 B2 * | 5/2008 | Melick et al. | 398/189 |
| 2004/0218679 A1 * | 11/2004 | Luna et al. | 375/240.23 |

* cited by examiner

*Primary Examiner* — Allen Wong
(74) *Attorney, Agent, or Firm* — Crawford Maunu PLLC (57) ABSTRACT

Input data is encoded using a look-up table and then transmitted over a transmission medium as a series of pulses. The look-up table includes data elements. The length of each pulse is calibrated to correspond to one of the data elements in the look-up table. Upon receipt at another end of the transmission medium, the data is decoded using a look-up table. This decoding includes measuring the length of each received pulse to match the measured length to a corresponding one of data elements in the look-up table.

20 Claims, 5 Drawing Sheets

CODED PULSE DATA TRANSMISSION USING A LOOK-UP TABLE

RELATED PATENT DOCUMENT

This patent document is a continuation under 35 U.S.C. §120 of U.S. patent application Ser. No. 12/273,933 filed on Nov. 19, 2008 now abandoned, which is fully incorporated herein by reference.

FIELD OF THE TECHNOLOGY

At least some embodiments disclosed herein relate to communication systems in general, and more particularly but not limited to, transmission of encoded data.

BACKGROUND

Light is a standard messenger in communications technology. Currently, the bits in data, audio or video traffic are sent through fiber optic cables as brief pulses of light. A pulse is a value of one, and the absence of a pulse equals zero. Each pulse may be millionths of a second or less, and standard fiber optic lines now typically run 2.5 billion to 10 billion bits (2.5 gigabits to 10 gigabits) per second.

The fiber optic cable itself consists of a bundle of single optical fiber strands, each barely the size of a human hair. At the center of each of these strands is the core, made of glass silica. A laser, which encodes data as pulses of light, sends the pulses through the fiber optic cable's core. Surrounding the core is a mirror-like optical material, called the cladding, which reflects the light back into the core. Because the cladding doesn't absorb light, the light pulses are able to travel long distances.

Both transmission lasers and light emitting diodes (LEDs) can be used as the light source, but lasers, which are more powerful, are more commonly employed. The laser can be roughly analogized to an extremely powerful flashlight that blinks billions of time each second. When the laser is turned on, the equivalent of a digital "1" is transmitted, and when it's off, a digital "0" is represented. The high level of internal reflectivity of the cladding in a fiber optic cable allows the light to be transmitted down the length of the cable, even through the many twists and turns of its run.

Light is sent into the fiber, and it bounces back and forth inside the fiber all the way to the other end, which is sometimes hundreds of miles away. Pulses of light in a fiber optic material can carry the same kind of information that is transmitted as electrical pulses in a copper wire. This information can be telephone conversations or data from computers and fax machines. A conventional copper wire can carry a few million electrical pulses each second. In contrast, an optical fiber can carry as many as 20 billion light pulses per second. Telephone companies are switching to fiber optic cables because they can handle huge numbers of conversations at one time, many more than conventional copper wire can carry.

BRIEF DESCRIPTION OF THE DRAWINGS

The embodiments are illustrated by way of example and not limiting with respect to the figures of the accompanying drawings, and in which like references indicate similar elements.

DETAILED DESCRIPTION

The following description and drawings are illustrative and are not to be construed as limiting. Numerous specific details are described to provide a thorough understanding. However, in certain instances, well known or conventional details are not described in order to avoid obscuring the description. References to one or an embodiment in the present disclosure are not necessarily references to the same embodiment; and, such references mean at least one.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

As used herein, a "look-up table" includes any reference table, library, or stored information that provides a set of data elements for reference during the encoding or decoding of transmitted data. The data elements in a look-up table may include, for example, numbers, text, binary code, and other data or data strings that correspond to values or characteristics associated with information being transmitted. Data elements contained in the look-up tables of other embodiments may include, for example, computer program elements (e.g., portions of code commonly used in a given program language corresponding to an encoded data transmission). In yet other embodiments, data elements may include pointers or references to other look-up tables.

The look-up table is often identical for both the encoding and decoding ends. In other embodiments, differences between look-up tables at the encoding and decoding ends may exist.

As used herein, a "series of pulses" includes the use of a series of light or dark pulses, in the case of light transmission, or a series of positive or negative pulses, in the case of electric or other forms of transmission, as may vary depending on the particular embodiment implemented. The systems and methods described herein are generally applicable to use of either a light or dark, or positive or negative, pulse. For purposes of explanation, the disclosure will generally describe the use of a light or a positive pulse.

As used herein, a "length" of a pulse means a time duration of the pulse.

Systems and methods for the transmission of data are described herein. Generally, input data to be transmitted is encoded using a look-up table to provide encoded data. The look-up table includes a plurality of data elements. The length of each pulse is calibrated to correspond to one of the data elements in the look-up table. The encoded data is transmitted as a series of pulses over a transmission medium such as, for example, a fiber optic cable.

Upon receipt at another end of the transmission medium, the data is decoded using a look-up table. The look-up table, at least to the extent of the data elements used to encode the data, is identical at the decoder. This decoding includes measuring the length of each received pulse to match the measured length to a corresponding one of the data elements in the look-up table.

Figure 1:
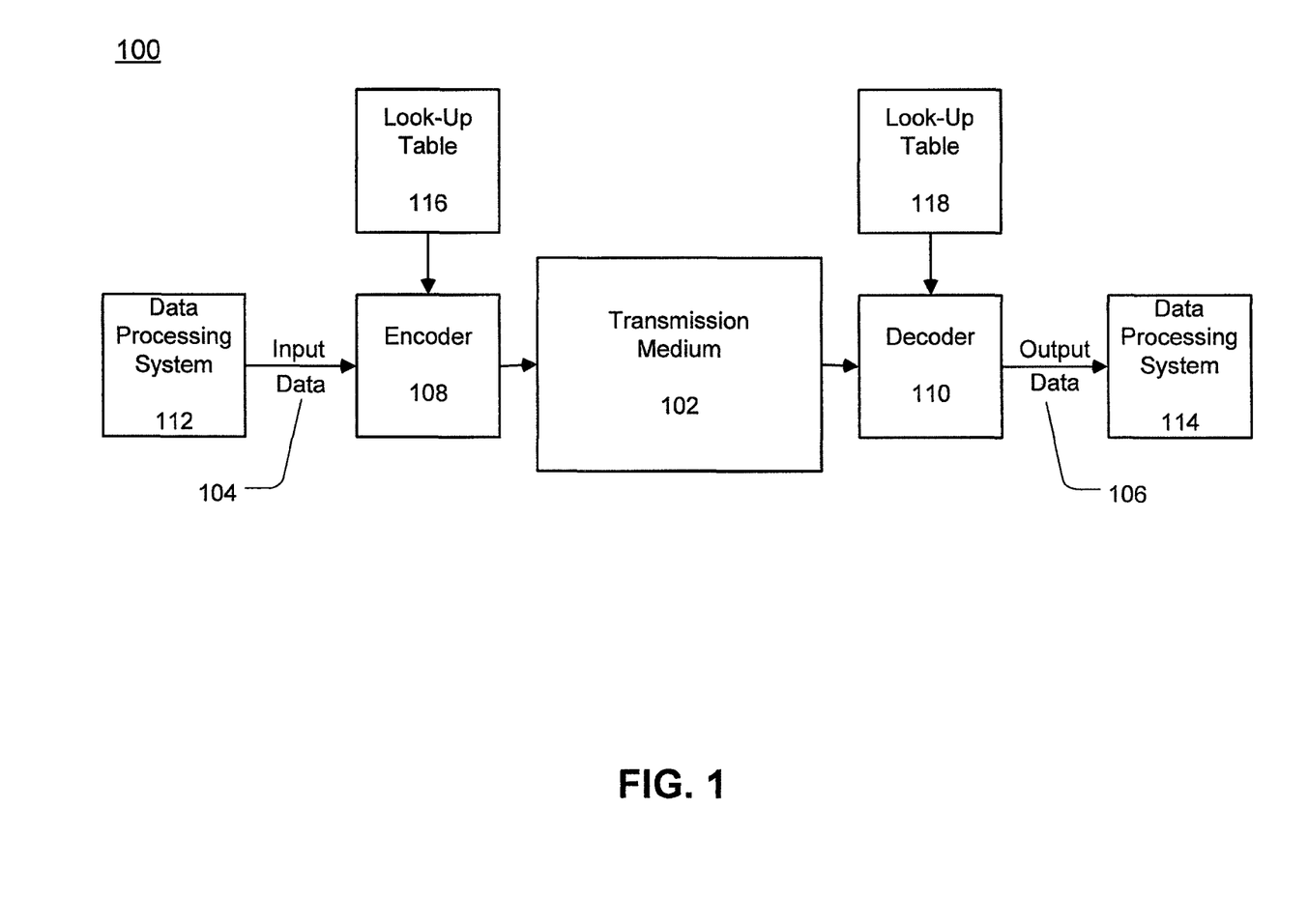
FIG. 1 shows a block diagram of a system for transmission of encoded data according to one embodiment.

FIG. 1 shows a block diagram of a system 100 for transmission of encoded data according to one embodiment. System 100 includes encoder 108 for encoding input data 104 using look-up table 116. The encoded data is sent over transmission medium 102 as a series of pulses (e.g., using a laser, as discussed in more detail below).

Data is received at another end of transmission medium 102 by a decoder 110. The data is decoded using look-up table 118. In one embodiment, look-up table 118 is identical to look-up table 116.

Transmission medium 102 may be, for example, a fiber optic line, a conventional copper wire line (e.g., for telephone communication), or a coaxial cable distribution system.

A data processing system 112 may be the source of the input data 104. Data processing system 112 may be, for example, a system that generates streaming video.

A data processing system 114 may receive the decoded output data at the receiving end. Data processing system 114 may be, for example, a user client device executing a streaming video or audio player for the user.

Figure 2:
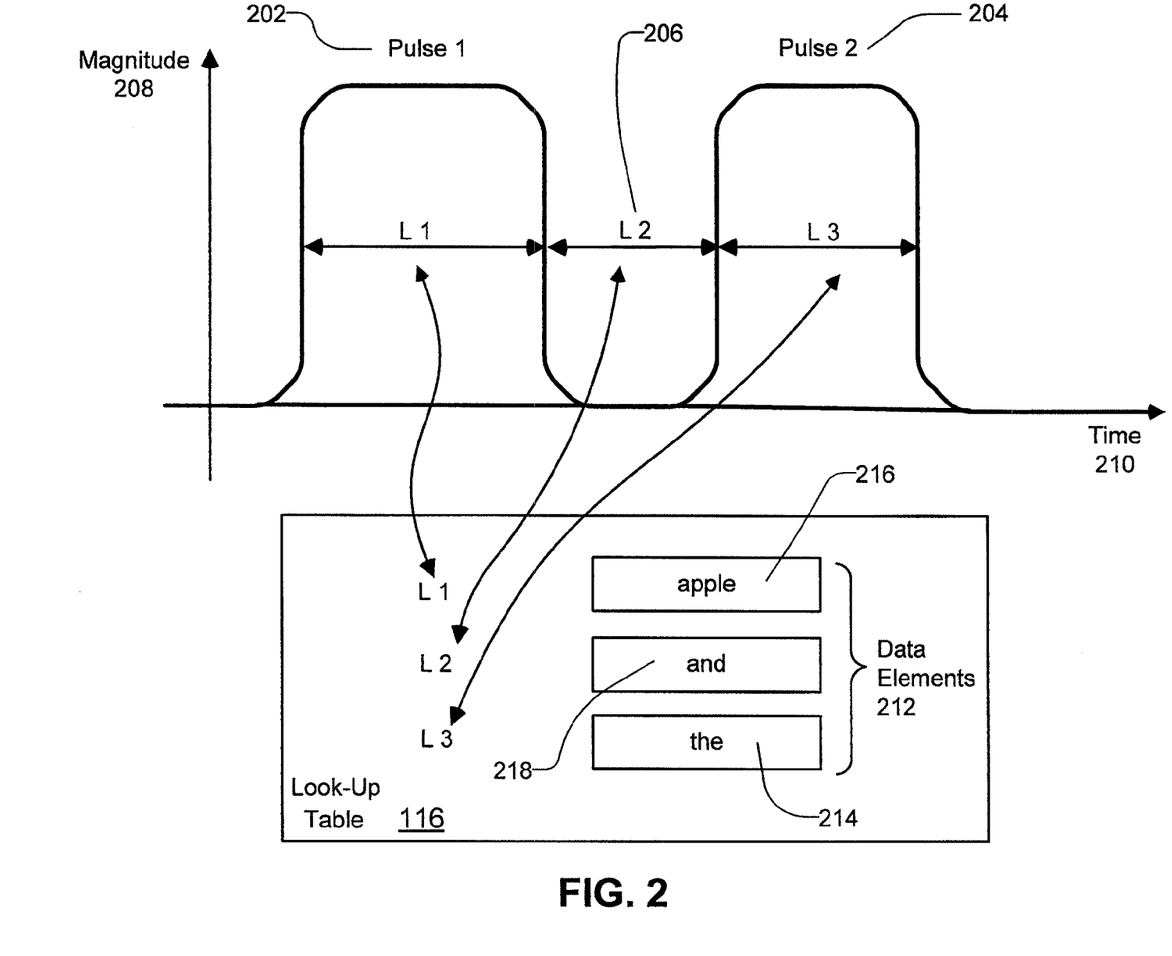
FIG. 2 shows an example of encoding/decoding a series of transmitted pulses according to one embodiment.

FIG. 2 shows an example of encoding/decoding a series of transmitted pulses 202, 204, 206 according to one embodiment. Each pulse has a magnitude 208 plotted against a transmission time 210. Light or positive pulses 202 and 204 each have a respective length L1 and L3. Dark or negative pulse 206 has a length L2.

Input data received by encoder 108 is encoded using data elements 212 in look-up table 116. These data elements typically correspond to the type of data (e.g., video, audio, or program) that is to be encoded. For example, for encoding a text document, exemplary data elements 214, 216, and 218 may include, respectively, the words "the", "apple", and "and". The types of data that may be encoded are numerous and include, for example, any type of images such as medical x-ray images and digital photography images, and many types of audio files.

Each pulse length corresponds to a data element 212 in the table 116. For example, pulse 2 has length L3 that is associated with data element 214. Input data is encoded so that the length of each transmitted pulse is determined by the corresponding entry in table 116.

In one embodiment, the data elements of table 116 are selected so that the more commonly occurring input data corresponds to shorter pulse lengths. This typically will increase the efficiency of transmission. For example, the word "the" is a common text string that would have a shorter pulse length L3. The word "apple" is less common than "the" and has a longer pulse length L1.

In one embodiment, the input data is, for example, video data (e.g., high definition (HD) television data). A number of look-up tables 116 may be used to encode such data, with the data elements in a first table being unique pixel locations in a video image, and data elements in a second table being colors for the video image.

In one embodiment, one or more of the pulse lengths are less than one thousandth of a second, and may even be defined or calibrated in lengths of time as short as trillionths or billionths of a second (e.g., less than 10 billionths of a second) and, for some of the pulses, as long as many seconds (e.g., greater than 2 seconds). In an alternative embodiment, some pulses may be measured by a distance of the pulse instead of a time duration of the pulse. Look-up tables corresponding to pulse distance would be used for encoding and decoding such pulses.

Delineations between sets of pulses to be encoded or decoded may be provided as coded elements to maintain pulse order and boundaries. For example, pre-defined breaks, a set pulse of a specific time, or a multiple set of pulses of light and dark may be used as delineating elements.

The size of the look-up tables 116, 118 may be, for example, about 1-10 million data elements, or even billions of data elements or larger, depending on the embodiment.

Figure 3:
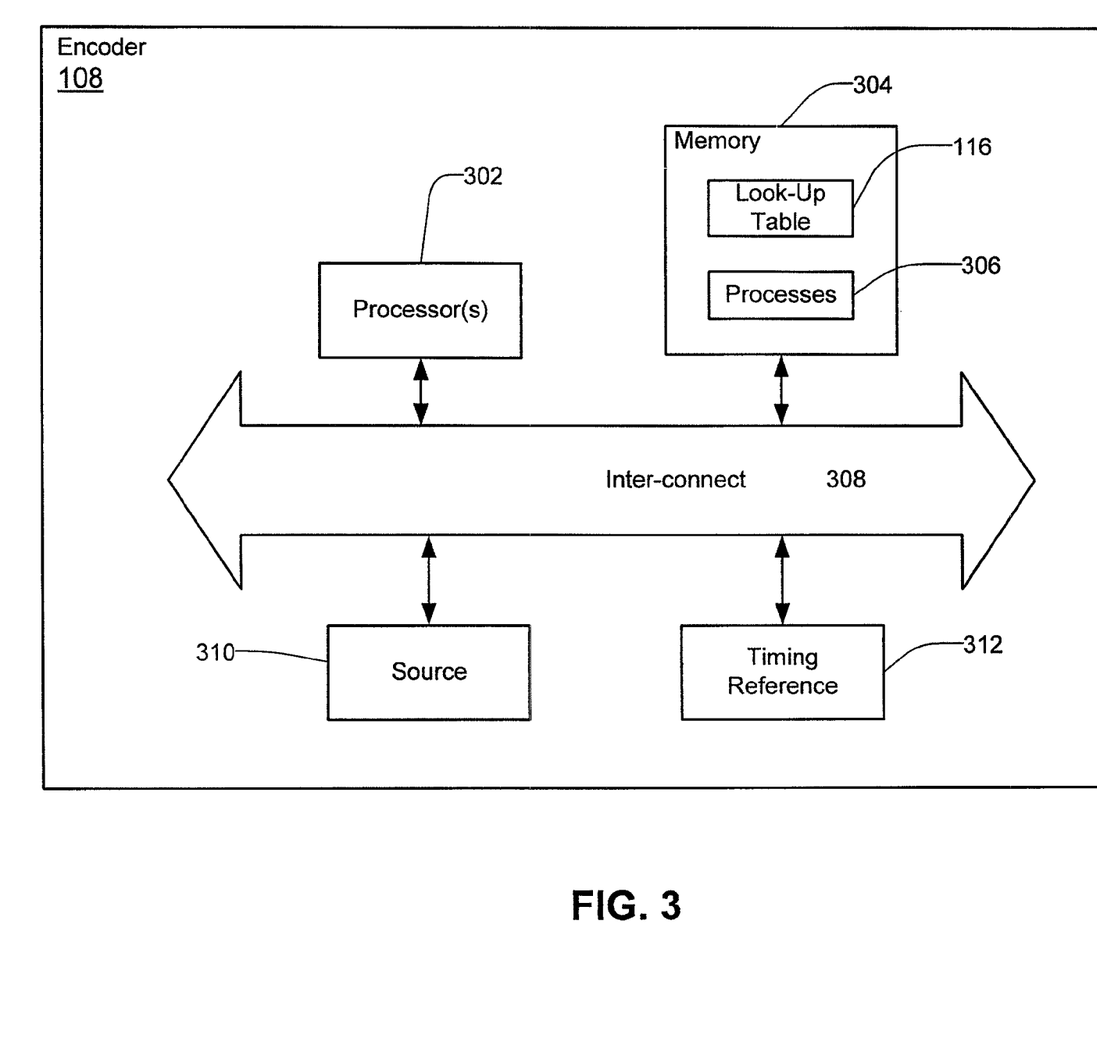
FIG. 3 shows a block diagram of an encoder according to one embodiment.

FIG. 3 is a block diagram of encoder 108 according to one embodiment. Encoder 108 includes one or more processors 302 and one or more memory devices 304 coupled by interconnect 308 (e.g., a system bus). A timing reference 312 provides a standard by which the lengths of the pulses may be determined for transmission by source 310. Look-up table 116 is stored in memory 304, and various processes 306 to be executed by processor 302 may also be stored in memory 304.

Timing reference 312 may be, for example, an atomic clock. An atomic clock may, for example, permit using differences in pulse length of about 2-3 billionths of a second.

One or more transmission lasers, or one or more light emitting diodes (LEDs), may be used, for example, as the source 310 for generating the series of pulses sent over transmission medium 102. Encoder 108 may use existing conventional hardware as used for existing light or electrical communications over various known transmission mediums, but modified to operate as described herein.

A large number of different look-up tables 116 may be stored in memory 304 (e.g., as used for encoding video data streams), and several tables may be used to encode different portions of transmitted data streams. A command may be transmitted over transmission medium 102 in order to identify the particular look-up table from the many accessible by encoder 108 in order to identify (for later decoding) those tables that were used to encode the data.

Figure 4:
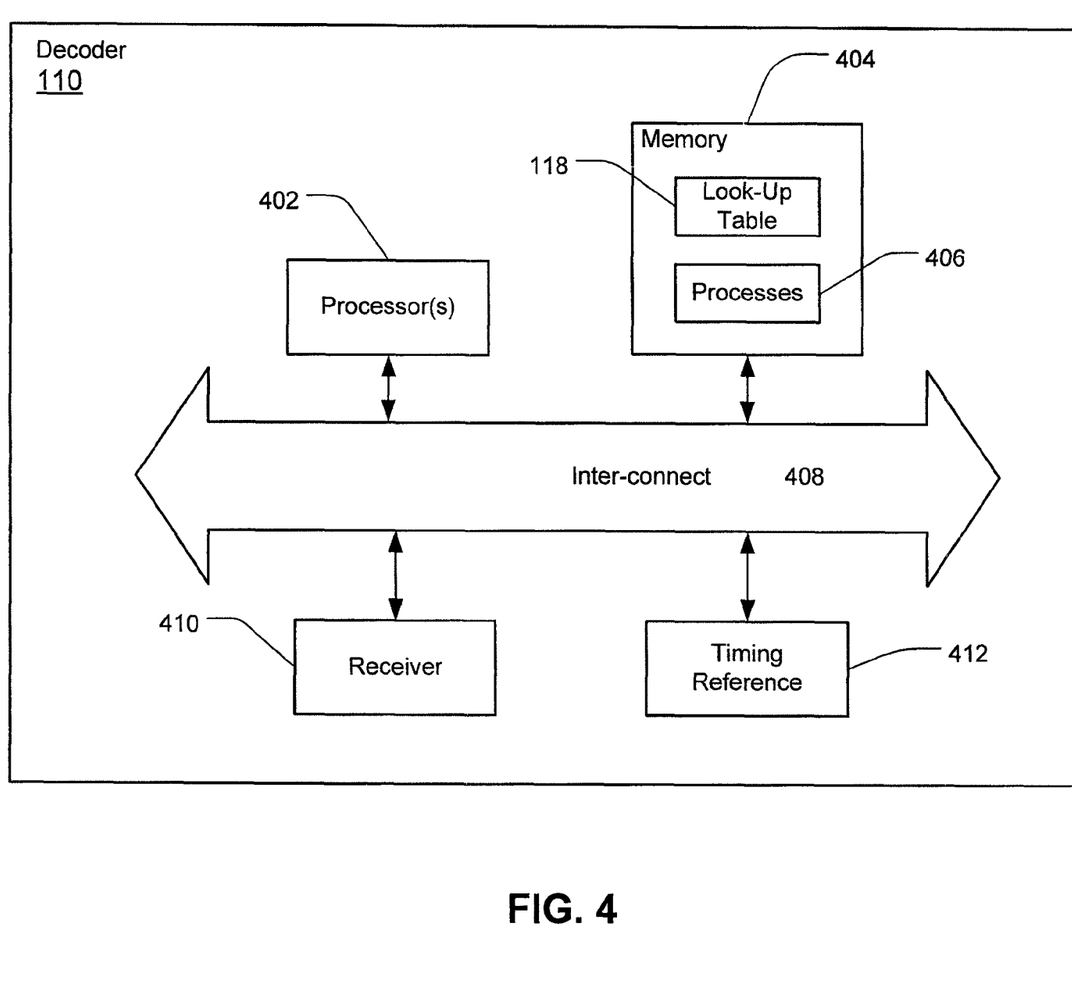
FIG. 4 shows a block diagram of a decoder according to one embodiment.

FIG. 4 shows a block diagram of decoder 110 according to one embodiment. Decoder 110 includes one or more processors 402 coupled to one or more memories 404 by interconnect 408. Memory 404 includes look-up table 118 and may further include processes 406 to be executed by processor 402. Decoder 110 may use existing conventional hardware as used for existing light or electrical communications over various known transmission mediums, but modified to operate as described herein.

Received pulses from transmission medium 102 are received by receiver 410. A timing reference 412 is used as a standard against which to measure the lengths of the received pulses. Receiver 410 may be, for example, an optical sensor. Timing reference 412 may be, for example, an atomic clock.

One exemplary approach for the timing of laser pulses received by a sensor may be implemented in a system using one or more photodiode detectors (e.g., an array of photodiode detectors). The use of such photodiode detectors and the timing of received pulses is described further in an article by D. A. Cohen, Y. Chang, A. F. J. Levi, H. Fetterman, and I. Newberg, titled "Optically-Controlled Serially-Fed Phased Array Sensor," IEEE Photonics Technol. Lett. 8, 1683-1685 (1996), which is incorporated by reference in its entirety.

Similarly as was discussed above for encoding, numerous look-up tables may be stored in memory 404 (e.g., for decoding video data streams). A command may be received from transmission medium 102 so that decoder 110 can select the appropriate look-up table 118 from many tables accessible by decoder 110.

More specifically, receiver 410 receives or senses each pulse (e.g., using an optical sensor) as pulses are received from transmission medium 102 by decoder 110. Under control of processor 402, each pulse is compared to timing reference 412 to measure the length of the pulse. The measured pulse lengths may be stored in memory 404 awaiting further processing.

Processor 402 controls a comparison of the measured pulse lengths against look-up table 118. Processor 402 retrieves data elements 212 from the appropriate look-up table 118, which can be selected using the command or other pointer received (e.g., a header information) as part of the transmission from transmission medium 102.

Each pulse length is associated with a data element 212 in look-up table 118. As data elements 212 are retrieved from one or more look-up tables 118, processor 402 controls the assembly and output of the retrieved data to provide output data 106.

In one embodiment, the pulses can be set for a unique program situation. For example, a set of words each having a unique pulse length for a first type of data (i.e., word data) to be transmitted do not need to be included in the same look-up table as a set of colors, which could use some of the same pulse lengths as used in the word look-up table. As another example, a look-up table can be associated with various portions of a computer program, once the application programming interface (API) is known. This association can be handled by an intermediary service company and the look-up table does not need to be prepared by the original programmer of the computer program.

In one embodiment, at the start of every transmission, the type of transmission may be defined (e.g., using a command as described above). For example, a video transmission may be defined by command data transmitted prior to (or even following in other embodiments) a series of pulses (e.g., as a header) corresponding to video data. This video command will be used to identify an appropriate unique look-up table. Similarly, a command may identify data for a word document, and be used to identify an appropriate unique look-up table for decoding a series of pulses for word data. A given length of pulse can be re-used for different types of data transmissions.

In one embodiment, each of the commands for defining the type of transmission can be a string of ones and zeroes (e.g., 1110001101010110), or can be a unique pulse length that has been predefined as corresponding to a command, which itself defines the type of data transmission and is used to select yet another look-up table for decoding. Also, computer programs may be predefined in this manner to make the transmission and look-up table usage more efficient.

In one embodiment, a portion of the encoded data sent over transmission medium 102 includes test data to adjust for line loss and other variations in transmission. This test data is decoded by decoder 110. The results from this decoding is communicated to encoder 108 as feedback, and based this feedback, the calibration of transmitted pulse lengths by encoder 108 is adjusted in order to compensate for variations in transmission medium 102.

The parameters of the existing line in the transmission medium 102 typically affect the possible range of variations in pulse lengths. For example, the longer pulses could be thousands of times longer than the shortest pulses (e.g., one pulse could be one billionth of a second, and another pulse could be five thousand billionths of a second).

As mentioned above, the shorter pulses may be used for the most commonly transmitted data. In other embodiments, processes may be established to use more commonly used elements of a computer program or a data transmission system for the shorter pulse lengths.

In one non-limiting example, a high definition (HD) television data stream (e.g., in a 1920×1080 format at 60 frames/second) is transmitted as the encoded data. It should be noted that in this example audio data is omitted from the calculations for purposes of simplified explanation. Download times would be slightly longer when accounting for audio data, with audio data in 5.1 or better format requiring an even greater download time.

The quantity of HD data to be transmitted may be estimated as follows:

HD pixel specifications (1920×1080 pixels) multiplied by 60 frames per second=1920×1080×60=124, 416,000 pixel data points/second of HD production.

Pixel color data points plus described colors for each pixel per second=2×124,416,000=248,832,000 points/second of HD production.

Thus, the total number of pixels plus the ascribed colors for each pixel is 248,832,000 data elements per second of HD production viewing. This does not include transition pulse codes, codes which define the end of a screen frame, an order to match pixels to color, an order to define pulses as colors/pixels, etc., which typically will only be a nominal portion of the total data to be transmitted. At a laser pulse rate of 20 billion pulses per second, with necessary gapping and variation spacing for individual characters and coding elements, an HD video download speed can be calculated as follows:

20,000,000,000 pulses per second divided by 248,832, 000 data elements per second of HD production=80 seconds of an HD production transmitted per second.

This corresponds, for example, to a total transmission time of about 90 seconds for a 2 hour HD movie.

Figure 5:
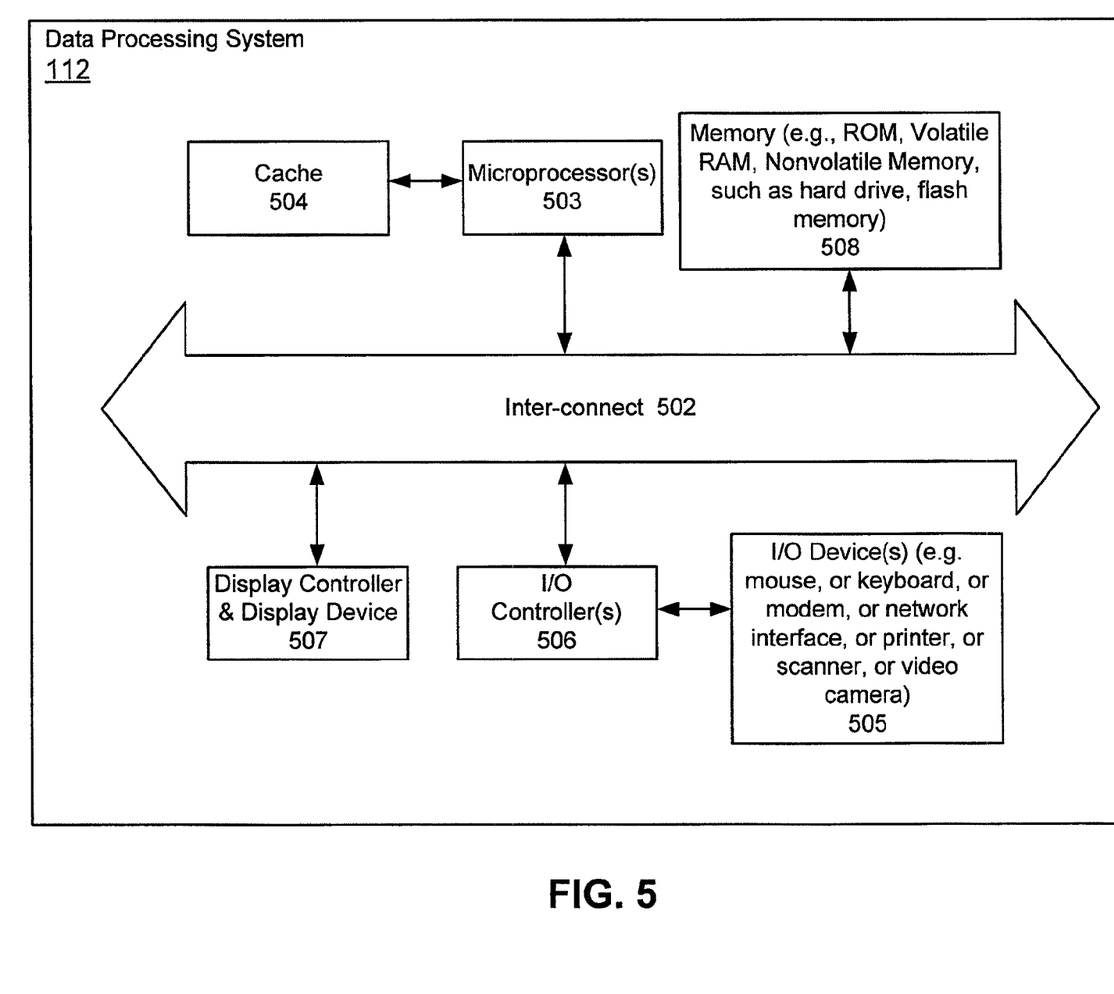
FIG. 5 shows a block diagram of a data processing system which can be used in various embodiments to provide input data or use output data.

FIG. 5 shows a block diagram of data processing system 112, which can be used in various embodiments to provide input data 104. Various components described here for FIG. 5 may also be used in other embodiments for data processing system 114 to use output data 106, or even in portions of encoder 108 or decoder 110.

While FIG. 5 illustrates various components of a computer system, it is not intended to represent any particular architecture or manner of interconnecting the components. Other systems that have fewer or more components may also be used.

In FIG. 5, data processing system 112 includes an inter-connect 502 (e.g., bus and system core logic), which inter-connects a microprocessor(s) 503 and memory 508. The microprocessor 503 is coupled to cache memory 504 in the example of FIG. 5.

The inter-connect 502 interconnects the microprocessor(s) 503 and the memory 508 together and also interconnects them to a display controller and display device 507 and to peripheral devices such as input/output (I/O) devices 505 through an input/output controller(s) 506. Typical I/O devices include mice, keyboards, modems, network interfaces, printers, scanners, video cameras and other devices which are well known in the art.

The inter-connect 502 may include one or more buses connected to one another through various bridges, controllers and/or adapters. In one embodiment the I/O controller 506 includes a USB (Universal Serial Bus) adapter for controlling USB peripherals, and/or an IEEE-1394 bus adapter for controlling IEEE-1394 peripherals.

The memory 508 may include ROM (Read Only Memory), and volatile RAM (Random Access Memory) and non-volatile memory, such as hard drive, flash memory, etc.

Volatile RAM is typically implemented as dynamic RAM (DRAM) which requires power continually in order to refresh or maintain the data in the memory. Non-volatile memory is typically a magnetic hard drive, a magnetic optical drive, or an optical drive (e.g., a DVD RAM), or other type of memory system which maintains data even after power is removed from the system. The non-volatile memory may also be a random access memory.

The non-volatile memory can be a local device coupled directly to the rest of the components in the data processing system. A non-volatile memory that is remote from the system, such as a network storage device coupled to the data processing system through a network interface such as a modem or Ethernet interface, can also be used.

In one embodiment, a data processing system as illustrated in FIG. 5 is used to implement a user terminal, which may receive streaming video or audio data. A user terminal may be in the form of a personal digital assistant (PDA), a cellular phone, a notebook computer or a personal desktop computer.

In some embodiments, one or more servers of the system can be replaced with the service of a peer to peer network of a plurality of data processing systems, or a network of distributed computing systems. The peer to peer network, or a distributed computing system, can be collectively viewed as a server data processing system.

Embodiments of the disclosure can be implemented via the microprocessor(s) 503 and/or the memory 508. For example, the functionalities described can be partially implemented via hardware logic in the microprocessor(s) 503 and partially using the instructions stored in the memory 508. Some embodiments are implemented using the microprocessor(s) 503 without additional instructions stored in the memory 508. Some embodiments are implemented using the instructions stored in the memory 508 for execution by one or more general purpose microprocessor(s) 503. Thus, the disclosure is not limited to a specific configuration of hardware and/or software.

In this description, various functions and operations may be described as being performed by or caused by software code to simplify description. However, those skilled in the art will recognize what is meant by such expressions is that the functions result from execution of the code by a processor, such as a microprocessor. Alternatively, or in combination, the functions and operations can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

While some embodiments can be implemented in fully functioning computers and computer systems, various embodiments are capable of being distributed as a computing product in a variety of forms and are capable of being applied regardless of the particular type of machine or computer-readable media used to actually effect the distribution.

At least some aspects disclosed can be embodied, at least in part, in software. That is, the techniques may be carried out in a computer system or other data processing system in response to its processor, such as a microprocessor, executing sequences of instructions contained in a memory, such as ROM, volatile RAM, non-volatile memory, cache or a remote storage device.

Routines executed to implement the embodiments may be implemented as part of an operating system, middleware, service delivery platform, SDK (Software Development Kit) component, web services, or other specific application, component, program, object, module or sequence of instructions referred to as "computer programs." Invocation interfaces to these routines can be exposed to a software development community as an API (Application Programming Interface). The computer programs typically comprise one or more instructions set at various times in various memory and storage devices in a computer, and that, when read and executed by one or more processors in a computer, cause the computer to perform operations necessary to execute elements involving the various aspects.

A machine readable medium can be used to store software and data which when executed by a data processing system causes the system to perform various methods. The executable software and data may be stored in various places including for example ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a machine readable medium in entirety at a particular instance of time.

Examples of computer-readable media include but are not limited to recordable and non-recordable type media such as volatile and non-volatile memory devices, read only memory (ROM), random access memory (RAM), flash memory devices, floppy and other removable disks, magnetic disk storage media, optical storage media (e.g., Compact Disk Read-Only Memory (CD ROMS), Digital Versatile Disks (DVDs), etc.), among others. The instructions may be embodied in digital and analog communication links for electrical, optical, acoustical or other forms of propagated signals, such as carrier waves, infrared signals, digital signals, etc.

In general, a machine readable medium includes any mechanism that provides (i.e., stores and/or transmits) information in a form accessible by a machine (e.g., a computer, network device, personal digital assistant, manufacturing tool, any device with a set of one or more processors, etc.).

In various embodiments, hardwired circuitry may be used in combination with software instructions to implement the techniques. Thus, the techniques are neither limited to any specific combination of hardware circuitry and software nor to any particular source for the instructions executed by the data processing system.

Although some of the drawings illustrate a number of operations in a particular order, operations which are not order dependent may be reordered and other operations may be combined or broken out. While some reordering or other groupings are specifically mentioned, others will be apparent to those of ordinary skill in the art and so do not present an exhaustive list of alternatives. Moreover, it should be recognized that the stages could be implemented in hardware, firmware, software or any combination thereof.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

The invention claimed is:

1. A method for transmission of data, the method comprising:
   accessing a plurality of data elements stored in a non-transitory computer readable storage medium;
   determining the type of data represented by the plurality of data elements;
   selecting a lookup table from a plurality of lookup tables based upon the type of data represented by the plurality of data elements, the plurality of lookup tables stored in a non-transitory computer readable storage medium;
   determining, from the selected lookup table, a time duration value for each data element of the plurality of data elements;
   forming a command that identifies the determined type of data, and encoded pulses with time durations that correspond to the time duration values; and
   transmitting the command and the encoded pulses over a transmission medium.

2. The method of claim 1, further including
   accessing another plurality of data elements stored in a non-transitory computer readable storage medium;
   determining another type of data represented by the other plurality of data elements;
   selecting another lookup table from the plurality of lookup tables based upon the other type of data represented by the other plurality of data elements;
   determining, from the other selected lookup table, another time duration value for each data element of the other plurality of data elements;
   forming other encoded pulses with time durations that correspond to the other time duration values; and
   transmitting the other encoded pulses over the transmission medium.

3. The method of claim 1, wherein the type of data represented by the plurality of data elements comprises video input data, and at least one data element of the plurality of data elements corresponds to at least one of a pixel location and a color in a video image.

4. The method of claim 1, wherein transmitting the encoded pulses over a transmission medium includes transmitting optical pulses over a fiber optic line using a laser.

5. The method of claim 1, further including the steps of receiving feedback from a receiver of the transmitted encoded pulses, the feedback indicating information about received pulse lengths, and adjusting time durations during further formation of encoded pulses based upon the received feedback.

6. The method of claim 1, wherein forming encoded pulses with time durations that correspond to the time duration values includes the use of an atomic clock as a timing reference.

7. The method of claim 1, wherein the time duration of the encoded pulse is less than one thousandth of a second.

8. The method of claim 1, wherein the encoded pulses form part of test data and wherein the test data is configured for decoding at a decoder, and further comprising compensating for variations in the transmission medium based on data received from the decoder corresponding to the test data.

9. The method of claim 1, further including sending a command prior to transmitting the encoded pulses, wherein the command identifies the type of data represented by the plurality of data elements.

10. The method of claim 1, further including storing the time durations of the lookup table from a plurality of lookup tables according to an expected occurrence rate of each of the data elements of the plurality of data elements.

11. The method of claim 1, further including after transmitting the encoded pulses over the transmission medium, decoding the pulses by:
    receiving a plurality of the encoded pulses from the transmission medium;
    measuring time durations for the received encoded pulses of the plurality of encoded pulses;
    determining the type of data represented by the plurality of received encoded pulses based on the command;
    selecting a lookup table from a plurality of lookup tables based upon the type of data represented by the plurality of received encoded pulses as indicated via the command, the plurality of lookup tables stored in a non-transitory computer readable storage medium;
    decoding, from the selected lookup table, a data element value for each time duration value of the plurality of encoded pulses; and
    storing the data element values in a non-transitory computer readable storage medium.

12. A method for decoding a pulse received from a transmission medium, the method comprising:
    receiving a command and a plurality of encoded pulses from the transmission medium;
    measuring time durations for the encoded pulses of the plurality of encoded pulses;
    determining the type of data represented by the plurality of encoded pulses, based on information in the command;
    selecting a lookup table from a plurality of lookup tables based upon the type of data represented by the plurality of encoded pulses, the plurality of lookup tables stored in a non-transitory computer readable storage medium;
    decoding, from the selected lookup table, a data element value for each time duration value of the plurality of encoded pulses; and
    storing the data element values in a non-transitory computer readable storage medium.

13. The method of claim 12, wherein the measuring includes comparing the time duration of the pulse to a timing reference.

14. The method of claim 12, wherein the transmission medium is a fiber optic line; and the receiving further includes sensing the pulse using an optical sensor.

15. The method of claim 12, further comprising:
    selecting, in response to receiving a second command, another lookup table to use in decoding another plurality of encoded pulses from the transmission medium, based on data in the second command.

16. A system for transmission of encoded data over a transmission medium, the system comprising:
    at least one non-transitory computer readable storage medium; and
    an encoder that includes least one processor, that is coupled to the at least one memory and that is configured to:
        access a plurality of data elements stored in the non-transitory computer readable storage medium;
        determine the type of data represented by the plurality of data elements;
        select a lookup table from a plurality of lookup tables based upon the type of data represented by the plurality of data elements, the plurality of lookup tables stored in a non-transitory computer readable storage medium;

determine, from the selected lookup table, a time duration value for each data element of the plurality of data elements;

form a command that identifies the determined type of data, and encoded pulses with time durations that correspond to the time duration values; and transmit the command and the encoded pulses over the transmission medium.

17. The system of claim 16, further comprising a laser to form the encoded pulses for transmission over a fiber optic line.

18. The system of claim 16, further comprising a decoder that includes a decoder non-transitory computer readable storage medium and a decoder processor and that is configured to:

receive the encoded pulses from the transmission medium;

measure time durations for the received encoded pulses;

determine the type of data represented by the received encoded pulses;

select the lookup table from a plurality of lookup tables based upon the type of data represented by the received encoded pulses;

decode, from the selected lookup table, a data element value for each time duration value of the received encoded pulses; and store the data element values in the decoder non-transitory computer readable storage medium.

19. The system of claim 16, wherein the plurality of data elements represent video data that includes pixel locations in a video image.

20. The system of claim 16, wherein the at least one processor is further configured to send a command prior to transmitting the encoded pulses, the command identifying the type of data as video data.

* * * * *